(12) United States Patent
Augendre et al.

(10) Patent No.: US 7,879,690 B2
(45) Date of Patent: Feb. 1, 2011

(54) METHOD OF FABRICATING A MICROELECTRONIC STRUCTURE OF A SEMICONDUCTOR ON INSULATOR TYPE WITH DIFFERENT PATTERNS

(75) Inventors: Emmanuel Augendre, Montbonnot (FR); Thomas Ernst, Morette (FR); Marek Kostrzewa, Grenoble (FR); Hubert Moriceau, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 122 days.

(21) Appl. No.: 12/413,130

(22) Filed: Mar. 27, 2009

(65) Prior Publication Data

US 2009/0246946 A1 Oct. 1, 2009

(30) Foreign Application Priority Data

Mar. 31, 2008 (FR) .................................. 08 52106

(51) Int. Cl.
*H01L 21/30* (2006.01)
*H01L 21/46* (2006.01)

(52) U.S. Cl. .............................. 438/459; 257/E21.088; 257/E21.122; 257/E21.48; 257/E21.519; 257/E21.561; 257/E21.568

(58) Field of Classification Search .......... 257/E21.088, 257/E21.122, E21.48, E21.519, E21.561, 257/E21.568; 438/458, 459

See application file for complete search history.

(56) References Cited

U.S. PATENT DOCUMENTS 5,168,078 A * 12/1992 Reisman et al. ............. 438/455
6,326,285 B1 * 12/2001 Behfar et al. ................ 438/455
7,341,923 B2 * 3/2008 Yonehara .................... 438/455
2008/0213973 A1 * 9/2008 Dao ........................... 438/458
2010/0047998 A1 * 2/2010 Yamazaki et al. ........... 438/458

FOREIGN PATENT DOCUMENTS

| EP | 0 767 486 A2 | 4/1997 |
| FR | 2 906 078 A | 3/2008 |
| WO | WO 2007/030368 A2 | 3/2007 |

OTHER PUBLICATIONS

French Search Report, dated Nov. 19, 2008—(2 pages).

* cited by examiner

*Primary Examiner*—Asok K Sarkar
(74) *Attorney, Agent, or Firm*—Brinks Hofer Gilson & Lione

(57) ABSTRACT

A microstructure of the semiconductor on insulator type with different patterns is produced by forming a stacked uniform structure including a plate forming a substrate, a continuous insulative layer and a semiconductor layer. The continuous insulative layer is a stack of at least three elementary layers, including a bottom elementary layer, at least one intermediate elementary layer, and a top elementary layer overlying the semiconductor layer, where at least one of the bottom elementary layer and the top elementary layer being of an insulative material. In the stacked uniform structure, at least two patterns are differentiated by modifying at least one of the elementary layers in one of the patterns so that the elementary layer has a significantly different physical or chemical property between the two patterns, where at least one of the bottom and top elementary layer is an insulative material that remains unchanged.

10 Claims, 3 Drawing Sheets

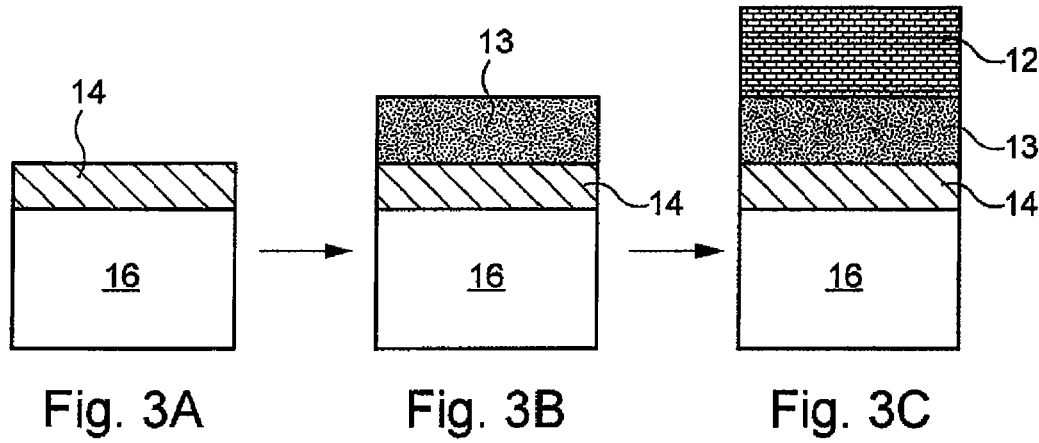
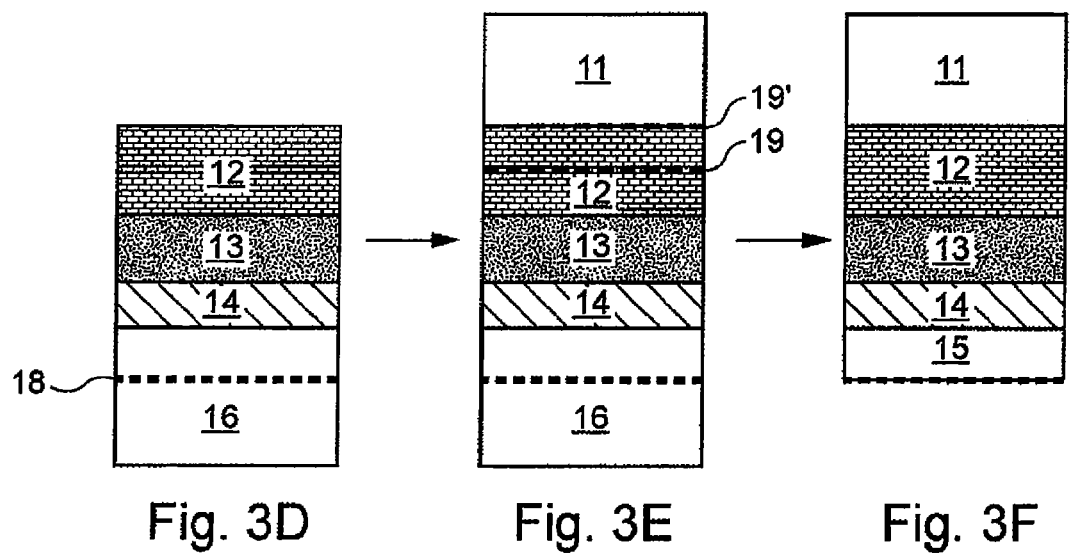

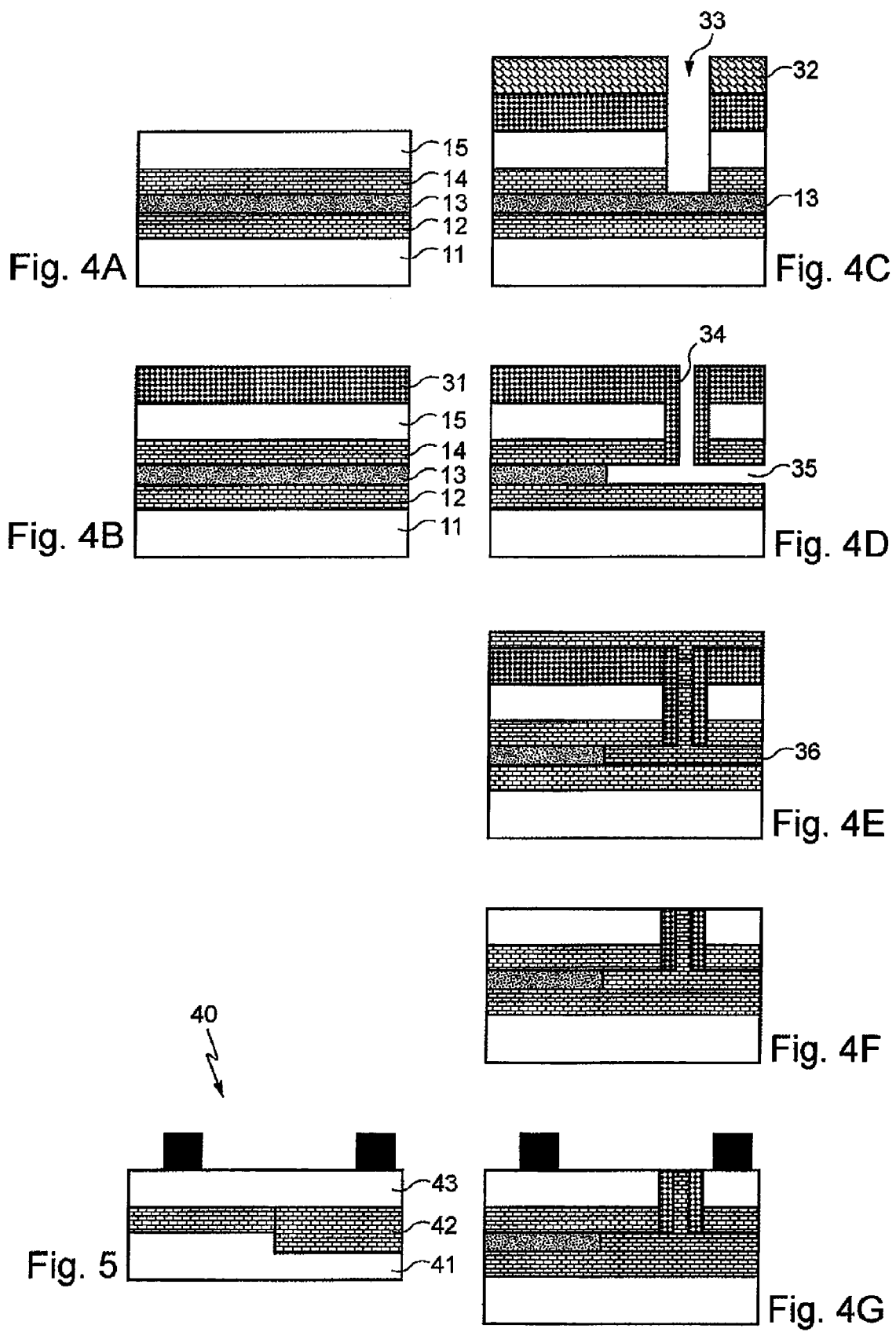

METHOD OF FABRICATING A MICROELECTRONIC STRUCTURE OF A SEMICONDUCTOR ON INSULATOR TYPE WITH DIFFERENT PATTERNS

RELATED APPLICATIONS

The present patent document claims the benefit of priority to French Patent Application No. 0852106, filed Mar. 31, 2008, which is incorporated herein by reference.

The invention concerns the production of a microelectronic structure of semiconductor on insulator type and including different patterns, utilizing the formation, on the same substrate, of patterns having, for example, different electrical or thermal conductivities and that can be activated independently.

TECHNICAL FIELD

The abbreviation "SOI" stands for "silicon on insulator". SOI is a particular case (of great practical importance) of a larger family of products including a semiconductor material on an insulator. Substrates of the semiconductor on insulator type thus consist of a stack of a thin semiconductor film on an insulator itself resting on a substrate. They have emerged as alternatives to bulk semiconductor substrates thanks to their original properties of electrical insulation and resistance to radiation.

In the context considered here, SOI can equally mean silicon on insulator and, by extension, semiconductor on insulator.

The SOI structures that are currently being examined with a view to future industrialization include the following substrates:

1) substrates with an ultrathin insulator (up to about ten nanometers thick), which optimize electrostatic integrity, 2) so-called "exotic" insulator substrates (for example silicon nitride, alumina, diamond, or stacks of such layers, instead of the usual bulk silica), which improve the evacuation of heat or enable charge trapping, and 3) substrates in which the thickness of the insulator is not uniform, to offer the best response to the constraints of the integration of heterogeneous systems.

BACKGROUND

At present, these specific substrates can be fabricated (and sold) by molecular bonding of two substrates one to the other, followed by thinning, for example by grinding, of one of them (these processes include BSOI (bonded SOI), BESOI (bonded and etched-back SOI), and Eltran (epitaxial layer transfer). These processes have the drawback of consuming two substrates in order to fabricate only one (one of the substrates being for the most part consumed during the thinning step).

In parallel with this, the Smart Cut™ process is a process for fabricating standard SOI substrates (using silica as the insulator with a thickness exceeding 50 nm), which is predominant at present for reasons as much of cost as of the quality of the material. In summary, this Smart Cut™ process consists, for example, in implanting a given species at a given depth in a substrate on the surface of which is formed a layer of oxide forming an insulator, and bonding a second substrate onto the surface provided with the insulator layer. This bonding is often molecular bonding, advantageously followed by consolidation heat treatment. A fracture is then produced at the level of the implanted layer, in practice at least in part by heat treatment, so that a substrate is obtained (the aforementioned second substrate) to which is bonded a thin layer of the aforementioned first substrate, hugging the layer of insulator.

However, the various known approaches have various limitations.

Thus the Smart Cut™ process includes a fracture step, necessary for separating the SOI substrate from the rest of the donor substrate, which step does not exist in the other processes (BSOI, BESOI, Eltran, etc.); it is true that this additional step enables reuse of the rest of the donor substrate, unlike other processes in which thinning consumes the whole of one of the substrates, except for the film forming part of the final SOI structure. However, this specific step of the Smart Cut™ process can create specific defects if particular precautions are not taken, for example in the case of certain thin insulators, if water is trapped in the bonding step.

In practice, the insulator of an SOI substrate can have thickness variations over the substrate; the final product can conventionally include various patterns whose specific characteristics depend on the specific future role of these patterns (especially where the insulator is concerned). At present, the fabrication of a substrate whose insulator is not of uniform thickness is determined by the subsequent use that will be made of it: the differences between the insulators of the various patterns are created during the fabrication of the substrate, according to a scheme determined by the end product. This specificity limits the versatility of the substrate (from the fabrication stage itself, it is no longer usable except in the target application, which in practice prevents fabricating substrates without knowing their intended use beforehand) and introduces, at the substrate fabrication stage, photolithography and etching steps (usually reserved for the production of integrated circuits) that constrain substrate fabricators to increase their investment in hardware and technological know-how in order to be able to carry out these steps. Moreover, the users of the substrates must share information on the use of their products with their substrate suppliers, which can compromise confidentiality in respect of the intended use of the substrates ordered from those suppliers.

SUMMARY

The object of the invention is the fabrication of a microelectronic structure of the semiconductor on insulator type having different patterns such that the specific features of the structure to be produced (especially where the electrical and/or thermal conductivity of the insulators of the target patterns are concerned) are taken into account only after a step of fabricating a uniform substrate. It should be noted that here "uniform" means uniform at the scale of at least two different patterns. Thus uniformity can be operative at the scale of a plurality of patterns, or even at the scale of a portion of the substrate, or even at the scale of the entire substrate.

In a subsidiary way, it also has the aim that this initial fabrication should be possible to carry out through the application of a process such as the Smart Cut™ process, with no restrictions as to the choice of the insulator.

To this end, the invention proposes a method of fabrication of a microstructure of the semiconductor on insulator type with different patterns, including steps in which:

there is produced a stacked uniform structure of the semiconductor on insulator type including a plate forming a substrate, a continuous insulative layer hugging this substrate and a semiconductor layer hugging this insulative layer by which it is separated from the substrate, this continuous insulative layer being formed of a stack of at least three elementary layers, including a bottom elementary layer, at least one intermediate elementary layer, and a top elementary layer hugging the semiconductor layer, at least one of the bottom elementary layer and the top elementary layer being of an (electrically) insulative material, then there is formed, in this stacked uniform structure, a plurality of at least two patterns differentiated by modifying one of these elementary layers in one of these patterns so that this elementary layer has a significant difference of a physical or chemical nature between these two patterns, at least one of the bottom and top elementary layer that is of insulative material remaining unchanged in these two patterns.

It is therefore clear that, because a stacked uniform intermediate structure is used, two steps can be distinguished, namely a step of fabricating the stacked uniform structure (effected by the fabricator) and a modifying, specializing or customizing step (which can be effected by the end user). This achieves economies in terms of fabrication and storage.

After this first step, the patterns can be freely differentiated by changing the elementary layer(s). The terms changing, adapting, modifying or modulating this layer will be used interchangeably to qualify the local modification of the physical and/or chemical nature of this layer, including its elimination or its replacement by another material.

Finally, given that this stacked uniform structure includes an insulative layer formed of a stack of at least two layers one of which hugs the substrate and the other hugs the semiconductor layer, different materials can be chosen for these two layers, in particular to enable good bonding between the top elementary layer and the semiconductor layer and between the bottom elementary layer and the substrate. The choice of the materials of the bottom and top elementary layers, at least one of which is an insulator, can also be made as a function of the steps to be effected at the time of specialization, for example in connection with wet etching operations.

The bottom and top elementary layers are advantageously both of an insulative material; this can be the same insulative material for both layers or different materials.

It is advantageously the intermediate elementary layer that is modified.

It should be noted that only one elementary layer is preferably modified to differentiate the patterns of the final structure, but that the modifications can alternatively affect more than one elementary layer.

The stacked uniform structure is advantageously formed by steps in which:

there is prepared a first substrate of a semiconductor material, there is prepared a second substrate, there are formed on the first and/or on the second substrate the elementary layers of said stack, the first substrate and the second substrate are bonded, advantageously molecularly bonded, together so that the stack is between the two substrates, the top elementary layer hugging the first substrate and the bottom elementary layer hugging the second substrate, the first semiconductor substrate is thinned to form said semiconductor layer attached to said stack.

This thinning can be mechanical-chemical thinning or the result of a fracture at the level of a fragile buried area of the substrate formed beforehand, advantageously formed before the bonding step, for example a porous zone or a fragile zone created by implantation of one or more gaseous species.

This obtains the advantages of a method for forming a thin layer such as the Smart Cut™ process for forming the semiconductor layer, whilst preserving great latitude in the choice of materials, in particular those of the stack.

According to other advantageous features of the method of the invention where applicable combined:

said elementary layer that is modified in a pattern is of semiconductor material and the modification of this elementary layer of said pattern includes a doping step, which facilitates modification of electrical conductivity characteristics (for example by ionic bombardment and thermal activation), said elementary layer that is modified in a pattern is of semiconductor material and the modification of this elementary layer of said pattern includes a step of introducing alloying elements (which can also be obtained by bombardment or by diffusion), which, through a choice of the respective properties (for example of electrical and/or thermal conductivity) of the initial material and the alloying element, enables adjustment of the properties of the overall layers of insulator (formed by the stacks) thus formed and modified, said elementary layer that is modified in a pattern is of semiconductor material or metal and the modification of this elementary layer of said pattern includes a step of changing the crystalline phase of the material of this elementary layer (to the various phases of a material there may correspond different electrical or thermal properties, for example in the case of carbon according to whether it is crystalline or amorphous), for example by localized heating, for example by means of a laser, said modification of the elementary layer of a pattern further includes a step of locally removing said elementary layer, preferably followed by a step of filling with a new material the space left by the local removal of the elementary layer, which enables thanks to the use of standard processes from the field of microelectronics, producing elementary layers consisting, according to their location, of completely different materials.

Of course, the various types of modification can be combined within the same structure; these modifications preferably concern the same elementary layer of the stacked structure, but the invention is generic to all cases in which modifications affect a plurality of elementary layers (there can be only one modification per pattern, or even two or more modifications within certain patterns).

A structure obtained by the aforementioned method can be recognized by the fact that it is a stacked semiconductor on insulator type structure including, on a support substrate, a plurality of patterns each including an insulative zone hugging the substrate and a semiconductor zone separated from the substrate by this insulative zone, characterized in that the insulative zones of at least two of said patterns of the plurality are each formed of a stack of at least three elementary layers, including a bottom elementary layer hugging the substrate and formed of a first material, at least one intermediate elementary layer, and a top elementary layer hugging the semiconductor zone formed of a second material, the first and/or the second material being an insulator material, two elementary layers of the insulative zones of said two patterns respectively occupying the same place in the constituent stacks of these two patterns having a significant difference of a physical or chemical nature, said insulative material being the same in the insulative zones of said two patterns.

It is clear that such a stacked structure produces different patterns, i.e. patterns having different properties, although differing primarily only in the composition of one of their elementary layers; the advantages referred to hereinabove with reference to the method stem from this in particular.

According to advantageous features of this structure of the invention, where applicable combined (corresponding in practice to those referred to above with reference to the method):

the difference between said elementary layers of the insulative zones results from a difference of electrical and/or thermal conductivity, said elementary layers of the insulative zones of said two patterns are respectively formed of a semiconductor material or metal and an insulative material or a void, said elementary layers of the insulative zones of said two patterns are respectively formed of a first material and the same material after it has been doped; this first material is advantageously electrically resistive, said elementary layers of the insulative zones of said two patterns are respectively formed of a first material and a void, said elementary layers of the insulative zones of said two patterns are respectively formed of a first material and another material consisting of an alloy of the first material with another chemical element; the first material is advantageously a resistive material and said other chemical element is advantageously a metallic element, said elementary layers of the insulative zones of said two patterns are respectively formed of the same material with two different crystalline phases.

It follows from the above that one aspect of the invention concerns the stacked uniform intermediate structure that the aforementioned method uses to arrive at the structure defined hereinabove, especially when the bottom and top elementary layers are both of insulative material.

This aspect of the invention proposes a stacked uniform structure including a plate forming a substrate, a continuous insulative layer hugging this substrate and a semiconductor layer hugging this insulative layer by which it is separated from the substrate, characterized in that this continuous insulative layer is formed of a stack of at least three elementary layers, including a bottom elementary layer of a first insulative material that hugs the plate forming the substrate, at least one intermediate elementary layer, and a top elementary layer of a second insulative material hugging the semiconductor layer, the bottom elementary layer and/or the top elementary layer being of an insulative material.

BRIEF DESCRIPTION OF THE DRAWING

Objects, features and advantages of the invention emerge from the following description, given by way of illustrative and nonlimiting example, with reference to the appended drawings, in which:

FIGS. 3A to 3F represent successive steps of a method of fabricating the stacked structure from FIG. 1, FIGS. 4A to 4G represent successive steps of a method for fabricating a particular microelectronic structure conforming to the theoretical diagram of FIG. 2, and FIG. 5 is a diagram of a standard microstructure for which the structure obtained by the method of FIGS. 4A to 4G can be substituted.

DETAILED DESCRIPTION

Figure 1:
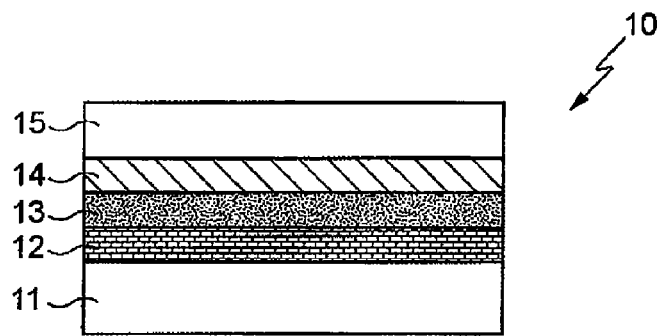
FIG. 1 is a diagram of a stacked uniform structure of the invention of the semiconductor on insulator type, ready to be customized using the method of the invention to obtain a particular microelectronic structure of the invention.
Figure 2:
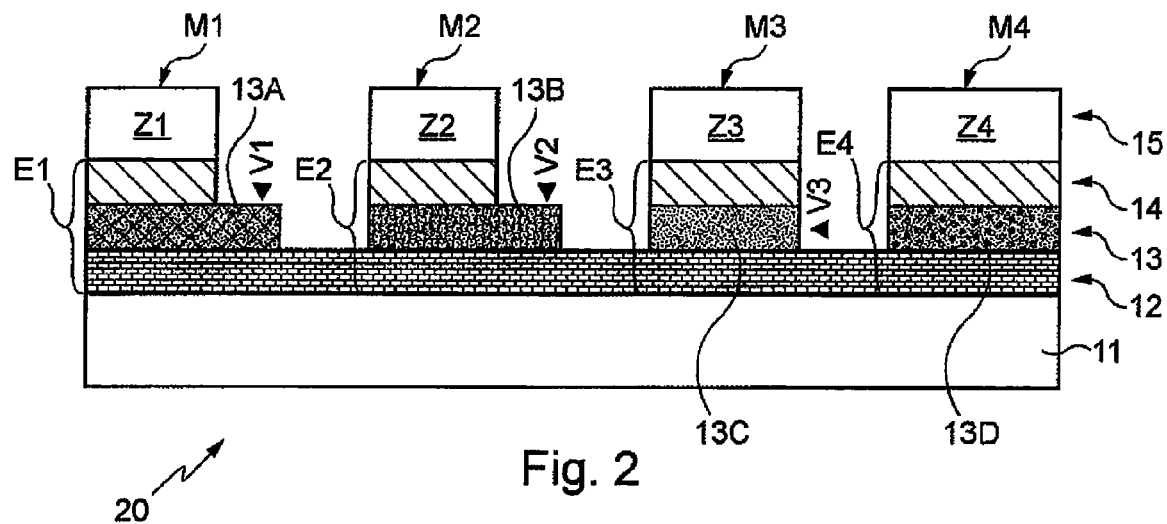
FIG. 2 is a theoretical diagram of a microelectronic structure of the semiconductor on insulator type and with different patterns, obtained from the stacked structure of FIG. 1 by use of the invention

Thus the appended figures represent three aspects of the invention, since FIG. 1 illustrates a stacked uniform structure (there is as yet no pattern), FIGS. 3A to 3F and 4A to 4G illustrate a method using such a structure, and FIG. 2 (and likewise FIG. 4G) represents a final structure resulting from the application of the method to the stacked uniform structure.

The stacked uniform structure can be said to be universal in the sense that it is still independent of the final destination of the particular structure that will be obtained from it; it is therefore capable of being specialized, customized or modified as a function of a very great variety of future uses.

Referring to this structure as uniform reflects the fact that the various layers that constitute it are continuous and of substantially constant thickness over distances greater than those of at least two patterns, or even a portion of the substrate or even the entire substrate, i.e. typically at a scale exceeding one centimeter, or even a few tens of centimeters, so that it can be said that it is a plate the usable part of which includes the aforementioned stack of continuous and constant layers.

More precisely, FIG. 1 represents a stacked structure of the semiconductor on insulator type, represented under the general reference 10. It includes a substrate 11, for example the size of a plate, surmounted by a stack of layers 12, 13 and 14 of which one or both of the outermost layers 12, 14 is/are insulative, and then a semiconductor film 15.

Such a structure differs from a standard SOI substrate in that, between the substrate and the semiconductor film, the bulk insulator is replaced by a stack of elementary layers one or both of the outermost layers of which is of an insulative material. In the example considered here, the two outermost layers are both of insulative material: the bottom layer 12, which hugs the plate 11, is of a first insulative material, while the top layer 14, which hugs the semiconductor film 15, is of a second insulative material, which first and second insulative materials can be the same or different. These various layers have constant thicknesses.

According to the invention, as will be described in detail hereinafter, at least one of the outermost layers that is insulative remains unchanged during the step of modification of the stacked uniform structure.

The number of layers is preferably odd, advantageously with alternating insulative layers and conductive (electrically resistive, but having a higher electrical conductivity than insulators) layers; in other words, if N is an integer number, the stack can include up to N+1 insulative layers, alternating with N layers in any materials, which can therefore be chosen as a function of other criteria. In the FIG. 1 example, the number N is equal to 1, which corresponds to the simplest application of the invention.

More generally, there is a stack of layers of which the first and/or the last is/are insulative, with an even or odd number of elementary intermediate layers.

There is advantageously chosen as the material of the layer 12 hugging the substrate 11 a material compatible with the use of a process such as the Smart Cut™ process (for example a thick layer of silica). This renders the choice of the material of the top layer independent of the constraints of the Smart Cut™ process. Thus any material (of any kind, of any thickness) can be used for this top layer 14, depending on the target application for the final structure, whilst retaining the benefits of the technological process.

Hereinafter the expression modifiable material will be used for the material constituting the elementary layer 12, 13 or 14, to reflect the fact that, during subsequent customization, the physical or chemical nature of this layer can be modified so as locally to "adapt" the properties of this layer, and therefore the properties of the stack (12-13-14), as a function of requirements.

Thus, according to the invention, at the time of customization (or specialization) of the stacked structure 10, the presence of the modifiable material of an elementary layer creates areas of different kinds, in particular from the point of view of the electrical or thermal conductivity of that layer, by locally modifying this elementary layer 12, 13 or 14, including replacing it by a void or by another material. Thus it is possible, after its fabrication, to transform the stacked uniform structure 10 from FIG. 1 into a structure in which the insulative stack, taken as a whole, is no longer uniform according to the requirements of the application, as is represented in FIG. 2.

The material of the intermediate layer 13 is typically a semiconductor, for example silicon (and more particularly polycrystalline silicon), and the material of the top layer 14 is advantageously an oxide of the material constituting the underlying intermediate layer (silica in the example of silicon). As for the material of the bottom layer 12, it is advantageously a material chosen from oxides, nitrides and materials with a wide electron gap.

FIG. 2 represents diagrammatically a final structure 20 of the semiconductor on insulator type with different patterns obtained from the stacked uniform structure 10 from FIG. 1 by local modification of the material constituting one of the elementary layers (here the intermediate layer 13).

Thus four patterns M1, M2, M3 and M4 can be distinguished on the same support substrate 11 as in FIG. 1.

In fact there can be identified a plurality of patterns each including an insulative zone hugging the substrate 11 and a portion of the semiconductor zone 15 separated from the substrate by this insulative zone.

The pattern M3 clearly results from the simple delimitation of a pattern in the stacked uniform structure from FIG. 1. Thus its insulative zone is formed of a stack E3 including a portion of the bottom layer 12 from FIG. 1, a portion of the intermediate layer 13 and a portion of the top layer 14, whereas its semiconductor zone Z3 is a portion of the semiconductor layer 15 from FIG. 1.

In the example represented in FIG. 2, the other patterns M1, M2 and M4 are all different from the pattern M3, but in the example considered here only in relation to the intermediate layer 13. Thus the insulative zones E1 to E4 all have substantially the same thickness, are all formed of a stack of the same number of layers, with a bottom layer hugging the substrate and formed of the same first (for example insulator) material for each pattern of the same thickness in each pattern, at least one intermediate layer and a top layer hugging the semiconductor zone and formed of a second material (for example also an insulator) of the same thickness in each pattern. Furthermore, the semiconductor zones Z1 to Z4 are formed of the same thickness of the same material (these are portions of the layer 15).

In other words, the layers that can be distinguished in each pattern are lined up with each other on moving from one pattern to another; it is in particular through this feature that it can be recognized that the structure was obtained from a stacked structure such as that of FIG. 1.

In the example considered, the portions of the bottom layer 12 are not delimited as a function of the patterns, since this layer is still continuous, as in FIG. 1. Of course, in a variant that is not represented, these portions respectively belonging to the patterns M1 to M4 can be delimited relative to each other.

At least one of the patterns has a significant difference in physical or chemical nature within one of the elementary layers, here the intermediate elementary layer 13. It must be understood here that there is a significant (or substantial) difference if the difference is very much greater than the usual fluctuations in a given fabrication process and can thus stem only from a deliberate intention to generate that difference.

This is advantageously a difference aiming to generate a difference of electrical conductivity (or a difference of both electrical and thermal conductivity, or even only a difference of thermal conductivity).

The intermediate layer has the same overall thickness in each pattern (even if the modification of this layer, within at least one of them, can lead to a slight thickness difference relative to the initial layer).

In the case considered here, three distinct examples of a difference are shown diagrammatically.

Thus the pattern M1 shows diagrammatically here the case of a pattern that differs from the pattern M3 by virtue of the fact that the material of its intermediate layer, designated by the reference 13A, results from the same material as that of the pattern M3 (i.e. that of the layer 13 in FIG. 1), through an alteration, for example through doping or through alloying with an additional element (for example introduced by electronic bombardment of the doping or alloying element and/or by diffusion of that element, for example by appropriate heat treatment).

The pattern M2 shows diagrammatically the case of another pattern that differs from the pattern M3 by virtue of the fact that the material of its intermediate layer, designated by the reference 13B, results from the same material as that of the pattern M3, also by virtue of an alteration, but with a magnitude or a nature different from the alteration of the layer 13A of the pattern M1.

As for the pattern M4, it shows diagrammatically the case of a further pattern that differs from the pattern M3 by virtue of the fact that the material of its intermediate layer, designated by the reference 13D, results from a greater modification of the material of the original layer 13, in the sense that the intermediate layer has been removed, by any appropriate known means, at the location of the pattern (for example from the sides formed at the time of delimiting the patterns), followed by possible replacement by a material independent of that of the original layer 13. Thus aluminum can be substituted for silicon, for example.

Clearly each of these modifications of the material (qualified here as a modifiable material) locally changes the properties of the insulative zone (taken as a whole), as seen by the semiconductor film Z1, Z2 or Z4, relative to the properties of the pattern M3.

Taking each of the patterns M1, M2 or M4 as a reference, each of the others can of course be considered to correspond to it apart from a modification of the material of its intermediate layer.

The structure from FIG. 2 can thus be analyzed as including patterns differing only in their insulative zones E1 to E4. Each of these patterns therefore comprises at least one modifiable layer which, in the example considered here, is interleaved between a first insulative layer and a second insulative layer, the stack and the semiconductor layer that is superposed on it being etched at least as far as the second insulative layer (namely the bottom elementary layer) so as to define patterns of at least two of the following types:

a type of pattern in which the modifiable material is left unchanged (for example the pattern M3), a type of pattern in which the modifiable material is at least partially altered, for example by doping or by alloying (for example the pattern M1 or the pattern M2), a type of pattern in which the modifiable material is at least partly altered in a different manner, in particular by different doping or different alloying (case of the patterns M1 and M2 compared the one to the other), a type of pattern in which the modifiable material is removed (case of the pattern M4 if the void left by removing the material of the layer 13 is not filled), and a type of pattern in which the modifiable material is removed and replaced by another material (case of the pattern M4 in which the void left by removing the material 13 is filled).

Clearly the above comments generally apply to the case where there is a plurality of intermediate layers between the top and bottom elementary layers: it suffices for there to be a modification of at least one of these intermediate layers to confer on one pattern properties different from those of an adjacent pattern. Moreover, it is not necessary for both the bottom and the top elementary layers to be of insulative material; it suffices for one of them to be so.

In the example described hereinabove, the intermediate layer is of semiconductor material; alternatively, it can be of metal. In this case, its modification can result from local replacement or a change of crystalline phase, for example by heat treatment, or of oxidation or any other treatment generating a modification to the nature of said layer.

More generally, another alternative is to modify not the intermediate layer but either the bottom or the top elementary layer. Given that at least one of these layers is insulative, care will nevertheless be taken to keep intact at least one layer that is insulative, of these two layers (that of these layers that is insulative, when only one of the bottom and top layers is insulative, or one of the bottom and top layers when each of the two is of insulative material).

In particular, especially for ESD (electrostatic discharge) applications, it can be beneficial if the bottom elementary layer 12 is of an insulative material and the top elementary layer 14 is also an insulative layer to replace the latter layer locally, for example by an electrically conductive (for example semiconductor, for example silicon) layer.

It is equally possible, in the case where the layers 12 and 14 are both of insulative material, to modify locally, at the level of a pattern, the bottom elementary layer 12. For example, if the bottom elementary layer 12 is initially an oxide, it can be locally replaced by a conductive material, for example silicon. Thus the patterns including silicon at the level of the bottom elementary layer will have an intermediate layer 13 in electrical contact with the substrate 11 while the patterns for which the insulative layer 12 has been retained will retain a thick insulator (12, 14) between the semiconductor layer 15 and the substrate 11.

Note in FIG. 2 that the residual portions of the top elementary layer and the semiconductor layer of the patterns M1 and M2 are narrower than the underlying layer corresponding to the original intermediate layer. This leaves free a surface facilitating the application of a potential to each of the intermediate layers of these patterns. Of course, this kind of free surface parallel to the substrate is not essential to enable the application of a potential (for example, no such free surface exists in the pattern M3).

In fact, a final structure of the invention provides for particular uses. Examples, described in the case of the structure from FIG. 2, are referred to hereinafter, V1 denoting the potential applied to the intermediate layer of the pattern M1, V2 the potential applied to the intermediate layer of the pattern M2, and V3 the potential applied to the intermediate layer of the pattern M3.

In a first example of use, the potentials V1 and V2 are particular potentials, while the other potential V3 is a floating potential.

In a second example of use, the first and second potentials V1 and V2 are respective particular potentials but are different (this enables certain of the patterns to be activated or de-activated).

The application of a particular potential to a modifiable layer of a pattern (i.e. the intermediate layer or either the top or bottom elementary layer) advantageously exploits the presence of a free contact surface. This free surface can advantageously be produced in an opening produced during the etching of the patterns.

FIGS. 3A to 3F represent diverse steps in the fabrication of a stacked uniform and universal structure according to FIG. 1.

In FIG. 3A, the process starts with a semiconductor substrate 16, on which there is produced a first layer (intended to form the top elementary layer 14), for example of an insulative material; there is then formed on this layer a second layer 13, for example of semiconductor material (for example polycrystalline silicon) or metal (FIG. 3B).

There follows the formation of a third layer, for example of insulator 12 (FIG. 3C). Its nature is advantageously chosen to favor the remainder of the process (see FIG. 3E); it is advantageously silica ($SiO_2$), for example obtained by thermal oxidation of part of the layer 13 if that layer 13 is made of silicon.

In FIG. 3D there is represented the result of steps of formation of a buried weakened layer 18. These steps typically include ionic bombardment with at least one species (typically hydrogen and/or helium) adapted to form cavities at a given depth, followed by heat treatment adapted to favor the weakening of this layer by means of the elements introduced by bombardment in this way. Implantation can take place before the production of the first layer or between the production of this first layer and the production of the second layer or between the production of this second layer and that of the third layer, or after the production of the stack of these three layers. FIG. 3E represents a step in which there is bonded, preferably molecularly bonded, to the layer 12, the substrate 11 intended to form the support substrate of the stacked structure from FIG. 1.

Two dashed lines 19 and 19' in FIG. 3E show diagrammatically two possible levels for the bonding interface, according to whether the substrate 11 itself includes a layer of oxide (case shown diagrammatically by the bottom dashed line 19) or not (case shown diagrammatically by the top dashed line 19'); it must nevertheless be clearly understood that this difference of level is merely one way to distinguish visually the two possible cases, while the bonding level is of course unique in each of the two cases.

It should be pointed out here that if the layers that are brought into bonding contact are of silicon oxide, very good bonding and mechanical strength qualities result.

In the example described hereinabove, all the elementary layers 12, 13 and 14 are produced on the substrate 16. In an alternative that is not represented, part of the stack is formed on the substrate 16 and the remainder of the stack is formed on the substrate 11; it is in fact possible for all or part of the layer 12, all the layer 12 and all or part of the layer 13, or the layers 12 and 13 and all or part of the layer 14 to be produced on the support substrate 11, the rest of these layers being, as in the example described, produced on the substrate 16. The bonding interface is then inside the stack 12, 13, 14, or even at the interface with the substrate 16.

Technology steps (in particular cleaning, polishing, location, etc. steps) can of course be carried out before and/or after each step of production of the various elementary layers.

Finally, as represented in FIG. 3F, a fracture treatment, of a thermal and/or mechanical nature, of any appropriate known type, separates the substrate 16 at the level of the weakened layer 18 into a thin semiconductor film corresponding to that referenced 15 in FIG. 1 and a block of semiconductor material that can be recycled for new steps of formation of stacked structures like that from FIG. 1.

Other techniques could of course be used for thinning the substrate 16 (mechanical-chemical thinning, fracture at the level of a porous buried zone, for example, and the like).

The material of the top layer 14 is advantageously insulative: it can be obtained by oxidation of the semiconductor and/or by the usual deposition processes (CVD, ALD) or growth processes (MBE) used for insulative materials (nitrides, oxidizers, materials with a wide gap such as diamond, and the like). Its thickness is typically from approximately 1 nm to a few hundred nanometers.

The material(s) of the intermediate layer(s) can also be deposited by the same methods. Their thicknesses vary in the same range of values.

The material of the layer 14 is typically an insulator, such as an oxide $SiO_2$ deposited by CVD (or obtained by oxidation if the intermediate layer is of silicon, for example) and from a few tens of nanometers to a few hundred nanometers thick.

Various examples can be given of the choice of the material the properties of which are to be modified to enable thereafter, at the stage of modification (or customization or specialization) of the stacked uniform structure, that particular properties from the point of view of electrical and/or thermal conductivity can be obtained locally.

In a first embodiment, the modifiable material is an electrically resistive material (for example silicon) which, during the customization operations, is more or less doped, at least locally (for example by ionic implantation and thermal activation) in at least one of the types of patterns so as to change its conductivity and its output work in the doped pattern.

In a second embodiment, the modifiable material is an electrically or thermally resistive material which, during the customization operations, is alloyed with a metal or substituted by a metal so as to improve its electrical or thermal conductivity or its output work (for example silicon silicided with Ni or Al).

In a third embodiment, the modifiable material is a semiconductor material (for example silicon or SiGe) which, during the customization operations, can be replaced in one of the patterns by an insulative material ($SiO_2$ by ALD for example) or by a void.

In a further embodiment, the modifiable material is a material able to change phase so that, as an effect of an appropriate treatment, at the time of the customization operations, at least one of the types of patterns changes crystalline state to modify its conductivity (for example resistive—crystalline or amorphous—carbon rendered more conductive by conversion to a graphite phase).

In a further embodiment, the modifiable material is an electrically insulative material (for example that of the bottom or top elementary layer) that is locally replaced by an electrically conductive material.

FIGS. 4A to 4G represent various steps of an example of customization of the stacked uniform and universal structure from FIG. 1 to obtain a customized final structure such as that represented in FIG. 4G.

The first step is to prepare the stacked uniform structure from FIG. 1 (FIG. 4A), with a layer 12 of $SiO_2$, a layer 13 of polycrystalline silicon, and a layer 14 also of $SiO_2$ (the layer 15 is here again of silicon); the surface of the semiconductor film 15 is then covered with a nitride layer 31 (FIG. 4B), typically of silicon nitride.

A resin layer 32 is then deposited, in which there are delimited by photolithography residual zones that resist etching, so as to create a trench 33 in the stack of layers as far as the layer 13 (FIG. 4C).

The resin 32 is then removed and nitride spacers 34 formed along the flanks of the trench, after which the material of the layer 13 is etched in the vicinity of the trench, thus leaving an empty space 35 (FIG. 4D).

The void 35 is then filled with an insulative material 36, for example an HTO type oxide deposited by LPCVD (low-pressure chemical vapor deposition) at a temperature around 800° C., with excellent conformance, enabling it to fill cavities having high aspect ratios (FIG. 4E).

By etching the oxide that has overflowed out of the trench and the nitride layer 31, there is then obtained (FIG. 4F) a structure including the same stack of layers as in the starting substrate in the left-hand part but having an insulative zone entirely formed of insulative materials in the right-hand part.

The structure can then be completed (FIG. 4G) by terminals for exploiting what the structure includes, in the right-hand part a thin insulator and in the left-hand part a thick insulator.

FIG. 5 represents a structure 40 that is equivalent from the electrical point of view, obtained by a conventional technique. Note that it includes a substrate 41 having a variation in thickness, a discontinuous insulative layer 42 having a complementary variation in thickness, and a semiconductor film 43, which has made it necessary to take account of the performance of this microstructure from the very first fabrication steps. Now, FIGS. 4A to 4G have shown that it is possible, thanks to the invention, to produce a final structure having the same electrical properties although having pushed the specific adaptations of the final structure beyond significant fabrication steps (namely those forming the stacked uniform universal structure).

The invention claimed is:

1. The method of fabricating a microstructure of the semiconductor on insulator type with different patterns, the method comprising:
    forming a stacked uniform structure comprising a continuous insulative layer overlying a substrate and a semiconductor layer overlying the insulative layer and separated from the substrate by the insulative layer,
    wherein the continuous insulative layer comprises a stack of at least three elementary layers, including a bottom elementary layer, at least one intermediate elementary layer, and a top elementary layer, wherein at least one of the bottom elementary layer or the top elementary layer, or both, comprises an insulative material,
    forming at least two patterns differentiated by modifying one of the at least three elementary layers in one of the at least two patterns so that the one elementary layer has significantly different physical or chemical properties between the at least two patterns, wherein the elementary layer that comprises insulative material remains unchanged in the at least two patterns.

2. The method according to claim 1, wherein each of the bottom and top elementary layers comprises an insulative material.

3. The method according to claim 1 or claim 2, wherein modifying one of the at least three elementary layers comprises modifying the at least one intermediate elementary layer.

4. The method according to claim 1, wherein forming the stacked uniform structure comprises:
    preparing a first substrate comprising a semiconductor material;

preparing a second substrate;

forming the at least three elementary layers on the first substrate or the second substrate or both, wherein the first substrate and the second substrate are bonded together so that the stack is between the first and second substrates, and wherein the top elementary layer overlies the first substrate and the bottom elementary layer overlies the second substrate; and thinning the first semiconductor substrate to form the semiconductor layer.

5. The method according to claim 4, wherein thinning the first substrate comprises fracturing a weakened buried zone in the first substrate.

6. The method according to claim 1, wherein modifying one of the at least three elementary layers comprises a doping step.

7. The method according to claim 1, wherein modifying one of the at least three elementary layers comprises introducing alloying elements in a semiconductor material.

8. The method according to claim 1, wherein modifying one of the at least three elementary layers comprises changing the crystalline phase of a semiconductor material or a metal of the one elementary layer.

9. The method according to claim 1, wherein modifying one of the at least three elementary layers comprises locally removing the elementary layer.

10. The method according to claim 9, wherein modifying one of the at least three elementary layers further comprises filling a space left by locally removing the elementary layer with a material.

* * * * *